(12) United States Patent
Masui

(10) Patent No.: US 7,420,999 B2
(45) Date of Patent: *Sep. 2, 2008

(54) NITRIDE SEMICONDUCTOR LASER ELEMENT AND METHOD FOR MANUFACTURING SAME

(75) Inventor: Shingo Masui, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/682,737

(22) Filed: Mar. 6, 2007

(65) Prior Publication Data

US 2007/0217461 A1 Sep. 20, 2007

(30) Foreign Application Priority Data

Mar. 20, 2006 (JP) ............................. 2006-077237
Feb. 16, 2007 (JP) ............................. 2007-035858

(51) Int. Cl.
H01S 5/00 (2006.01)

(52) U.S. Cl. ................................. 372/43.01; 372/46.01

(58) Field of Classification Search ............. 372/46.01, 372/45.01, 50.21, 50.1, 75
See application file for complete search history.

(56) References Cited

U.S. PATENT DOCUMENTS

| 2002/0110945 A1* | 8/2002 | Kuramata et al. ............. 438/36 |
| 2005/0111506 A1* | 5/2005 | Ohta et al. .................... 372/46 |
| 2005/0218414 A1* | 10/2005 | Ueda et al. .................... 257/94 |
| 2007/0121691 A1* | 5/2007 | Sugiyama et al. ........ 372/43.01 |
| 2007/0290230 A1* | 12/2007 | Kawaguchi et al. ......... 257/196 |

FOREIGN PATENT DOCUMENTS

| JP | H10-27079 A | 1/1998 |
| JP | H10-270792 A | 10/1998 |
| JP | 2005-64262 A | 3/2005 |
| JP | 2005-166718 A | 6/2005 |

* cited by examiner

Primary Examiner—Minsun Harvey
Assistant Examiner—Tuan N. Nguyen
(74) Attorney, Agent, or Firm—Global IP Counselors, LLP

(57) ABSTRACT

A nitride semiconductor laser element, comprises a substrate, a nitride semiconductor layer laminated on said substrate and having a ridge on its surface, a first protective film that covers said nitride semiconductor layer, and an electrode form on the ridge and the first protective film, wherein the first protective film covers part of the nitride semiconductor layer surface in a contact state, and covers from the periphery around the base of the ridge to the side faces of the ridge in a non-contact state, resulting in a cavity being disposed from said ridge side faces to the ridge base periphery.

12 Claims, 6 Drawing Sheets

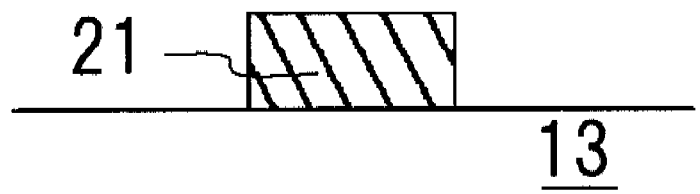
Fig.2a
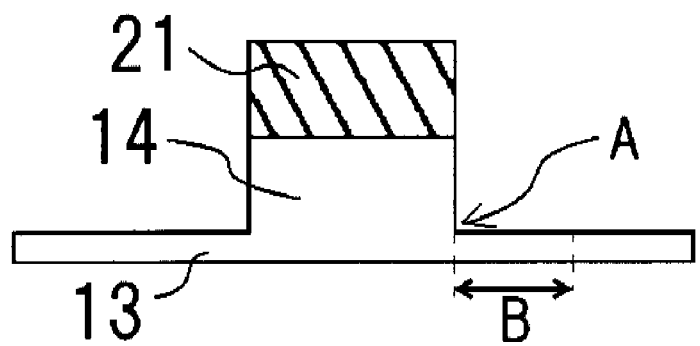
Fig.2b
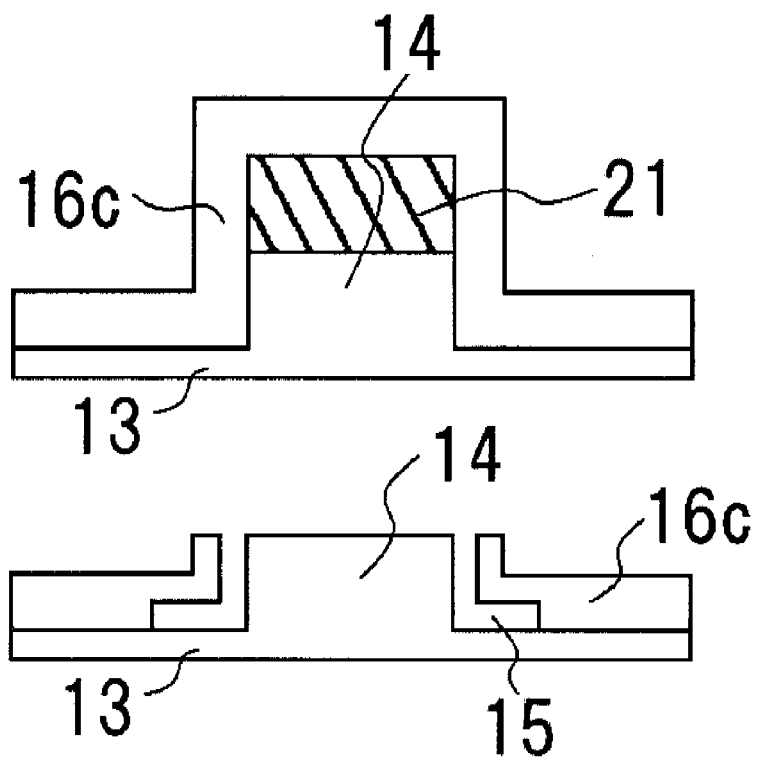
Fig.2c
Fig.2d

NITRIDE SEMICONDUCTOR LASER ELEMENT AND METHOD FOR MANUFACTURING SAME

BACKGROUND OF THE INVENTION

1. Field of the Invention

The present invention relates to a nitride semiconductor laser element and to a method for manufacturing this element, and more particularly relates to a nitride semiconductor laser element having a ridge waveguide structure, and to a method for manufacturing this element.

2. Description of the Prior Art

There is a growing need for semiconductor laser elements featuring a nitride semiconductor formed from a compound semiconductor of $In_xAl_yGa_{1-x-y}N$ ($0 \leq x$, $0 \leq y$, $0 \leq x+y \leq 1$) to be utilized in optical disk systems that allow large-capacity and high-density information recording and reproduction, such as next-generation DVDs, and to be utilized in personal computers and other such electronic devices. Accordingly, a great deal of research has gone into semiconductor laser elements that make use of nitride semiconductors.

In particular, various researches as been aimed at laser element structures, the result of which is that a structure which allows favorable lateral mode control, a structure that affords reduced power consumption, higher output, better reliability, a smaller size, a longer service life, and so forth, and other such structures have been proposed. Of these, the structures that are viewed as the most promising are those having a ridge waveguide structure, and this ridge waveguide structure has even been employed in nitride semiconductor laser elements, which were the world's first to appear on the market.

Also, further threshold current reductions are needed for nitride semiconductor laser elements. Reducing the threshold of a laser element requires that the horizontal-lateral mode be stabilized.

Usually, with a laser element featuring a ridge waveguide structure, optical confinement in the lateral mode must be carried out with good control and reproducibility in order to stabilize the horizontal-lateral mode, and a known way of accomplishing this is to use a protective film with a low refractive index as an embedding film.

For example, there has been proposed a compound semiconductor laser capable of lateral mode control, in which an embedding layer composed of a dielectric film is formed on both sides of a ridge component (see Japanese Laid-Open Patent Application H10-270792, for example).

There has also been proposed a laser element comprising a ridge composed of a second cladding layer of a second conductivity type and a cap layer of a second conductivity type, a dielectric film formed on the side faces of the ridge except for the very top part of the ridge, and an electrode metal layer that covers the ridge, wherein there is a cavity between the dielectric film or electrode metal layer and the subsequently formed thick-film electrode, in the upper face portion of the ridge (see Japanese Laid-Open Patent Application 2005-166718, for example). Also, the formation of a gap at the ridge of a laser element has been proposed (Japanese Laid-Open Patent Application 2005-64262).

However, the optical confinement of a laser element in which a protective film with a low refractive index is formed on the side faces of the ridge and on the surface of a nitride semiconductor layer on both sides of the ridge is dependent on the material of this protective film.

Also, it was difficult to control optical confinement in the horizontal-lateral mode because it affected the adhesion and thickness of the protective film formed on the semiconductor laser on both sides of the ridge. Optical confinement in horizontal lateral mode requires that the refractive index difference from that of the nitride semiconductor layer be made equal on both sides of the ridge, rather than just employing a protective film with a low refractive index and providing this refractive index difference.

With the structure described in Japanese Laid-Open Patent Application H10-270792, for example, the embedding layer is formed in a thickness that is equal to the height of the upper surface of the ridge from the exposed part of the semiconductor laser, so a difference in the coefficients of thermal expansion between the semiconductor laser and the embedding layer may result in interfacial separation between the embedding layer and the semiconductor laser, which leads to current leakage. There is also the danger that cracks will develop in the embedding layer and that current will leak from these cracks.

With the semiconductor laser element described in Japanese Laid-Open Patent Application 2005-166718, there is an cavity on the outside of the dielectric film formed on the side faces of the ridge, so lateral mode control is unlikely to be possible. Furthermore, since this semiconductor laser element is a GaAs-based semiconductor element, it has an eave-like shape, but with a nitride semiconductor the ridge shape tends to be difficult to form in an eave shape.

Also, with a configuration in which a gap is enclosed by a dielectric film, a large current is required, and with a GaN-based semiconductor element that is prone to generating heat, its operation over time results in stress being applied between the gap and the dielectric film. Consequently, separation tends to occur at the interface between the two, the gap itself becomes unstable, and this causes the operating current to be unstable, making it impossible to control optical confinement.

SUMMARY OF THE INVENTION

The present invention was conceived in light of the above situation, and it is a particular object thereof to provide a low-threshold nitride semiconductor laser element in which the lateral mode is stabilized by controlling the confinement of light from a nitride semiconductor laser, and a method for manufacturing this element.

The present invention provides a nitride semiconductor laser element, comprising a substrate, a nitride semiconductor layer laminated on said substrate and having a ridge on its surface, a first protective film that covers said nitride semiconductor layer, and an electrode formed on the ridge and the first protective film, wherein the first protective film covers part of the nitride semiconductor layer surface in a contact state, and covers from the periphery around the base of the ridge to the side faces of the ridge in a non-contact state, and a cavity is disposed from said ridge side faces to the ridge base periphery.

Further, the present invention provides a method for manufacturing a nitride semiconductor laser element, comprising the steps of:

forming a nitride semiconductor layer on a substrate;

forming a mask pattern on said nitride semiconductor layer and forming a ridge using said mask pattern for etching;

forming a first protective film on both sides of the ridge, the mask pattern, and nitride semiconductor layer exposed after the formation of the ridge; and removing the first protective film present on the mask pattern, and the mask pattern, and removing the first protective film extending from the ridge side faces to the ridge base periphery to form an cavity in at least part of the region which is an interface between the nitride semiconductor layer and the first protective film, and is extending from both sides of the ridge to the surface of the nitride semiconductor layer on both sides of the ridge.

With the nitride semiconductor laser element of the present invention, a cavity (or gap) is formed on both sides of a ridge, which effectively minimizes the stress applied to the interface between a first protective film and the ridge, and also extends the service life characteristics. In addition, this cavity stabilizes optical confinement. This is not limited to a single-mode nitride semiconductor laser element, and can also be employed in multi-mode nitride semiconductor laser elements. Furthermore, because control of the horizontal lateral mode is possible when the present invention is applied to a single-mode nitride semiconductor laser element, the threshold can be lowered, and a further decrease in power usage can be achieved.

Also, with the method of the present invention for manufacturing a nitride semiconductor laser element, a cavity can be formed with good control on both sides of a ridge, making it possible to manufacture a high-performance nitride semiconductor laser element in a simple way.

BRIEF DESCRIPTION OF THE DRAWINGS

FIG. 2a to 2d are simplified cross-sectional process views illustrating the method for manufacturing the nitride semiconductor laser element of the present invention;

DETAILED DESCRIPTION OF THE PREFERRED EMBODIMENTS

The nitride semiconductor laser element of the present invention is mainly constituted by a substrate, a nitride semiconductor layer, a first protective film, and an electrode.

Figure 1A:
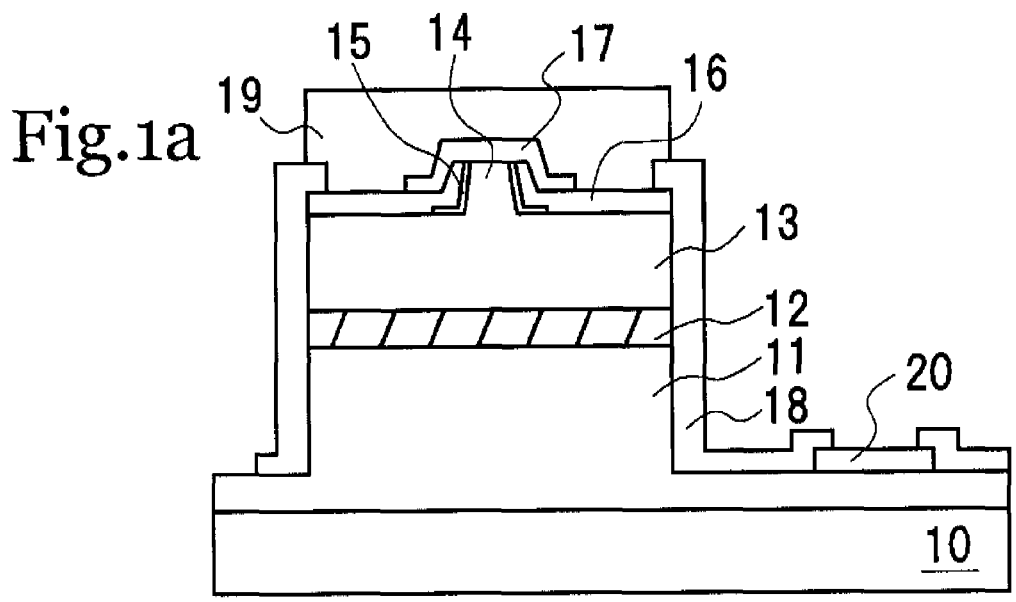
FIG. 1a and 1c are simplified cross-sectional views of the main components of the nitride semiconductor laser elements of the present invention, 1b is enlarged cross-sectional view of the part structure thereof.
Figure 1B:
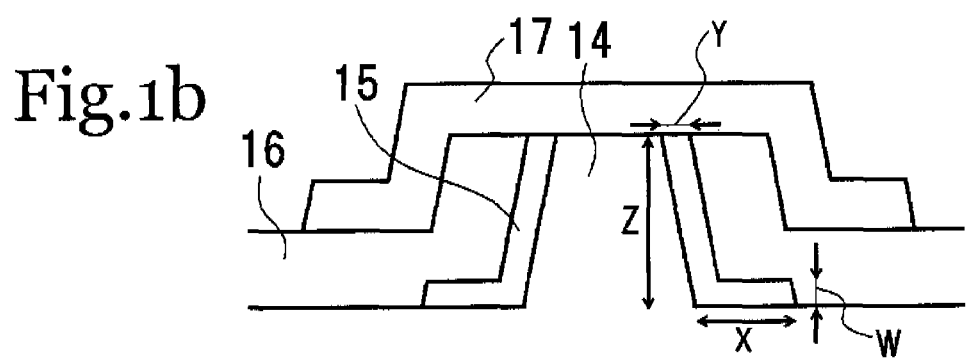

For example, as shown in FIGS. 1a and 1b, an n-side semiconductor layer 11, an active layer 12, and a p-side semiconductor layer 13 are formed as nitride semiconductor layers, in that order, on a first main face of a substrate 10 having first and second main faces. A ridge 14 is formed on the surface of the nitride semiconductor. A resonance face is formed at the end face in a direction substantially perpendicular to the direction in which the ridge 14 extends. A first protective film 16 is formed on both sides of the ridge 14. An electrode (called here a p-electrode 17) that electrically connects to the top face of the ridge 14 is formed from the first protective film 16 on the p-side semiconductor layer 13 to the top face of the ridge 14. A second protective film 18 is formed on the side face of the nitride semiconductor layer from above the first protective film 16. Further, a pad electrode 19 that extends to the first protective film 16 and is connected to the p-electrode 17 is formed on the p-electrode 17. Also, as shown in FIG. 1a, an n-electrode 20 may be formed above the substrate 10, as well as an n-electrode 20 may be formed on a second main face of the substrate 10 (see FIG. 1c).

With this nitride semiconductor laser element, the first protective film 16 covers part of the nitride semiconductor layer surface in a contact state, and covers the ridge side faces from around the periphery of the base of the ridge 14 in a non-contact state, so that a cavity 15 is disposed at an interface between the nitride semiconductor layer and the first protective film, i.e., from the ridge 14 side faces to the ridge 14 base periphery. In other words, the first protective film 16 is formed on the surface of the nitride semiconductor layer via the cavity 15, which is contiguous over a region from the ridge 14 side faces all the way to the surface of the nitride semiconductor layer on both sides of the ridge 14. The term "ridge base periphery" as used here means the vicinity of the outer periphery (the portion where the side faces extend) of the ridge base. For instance, in FIG. 2b, this refers to a region B, from the outer periphery of the ridge 14 base periphery (arrow A) to about one-half the width of the ridge base on the nitride semiconductor layer surface. This region B extends to about 20 μm or less from the outer periphery of the ridge 14 base periphery (arrow A).

Figure 1C:
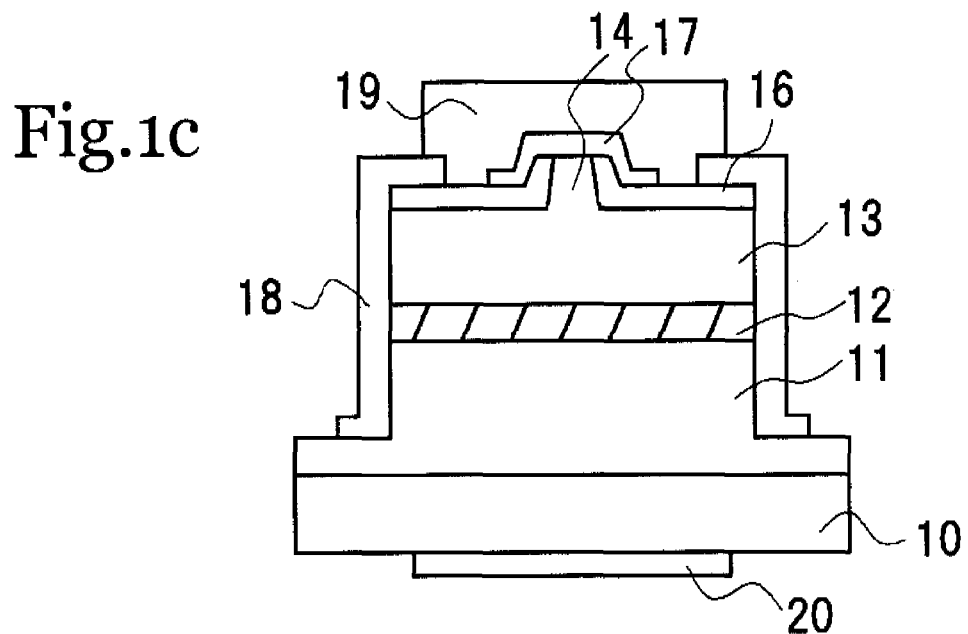
Figure 5A:
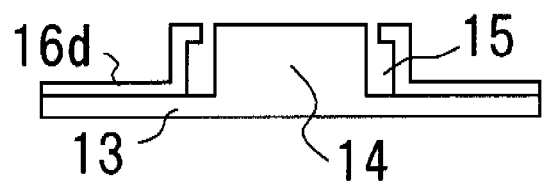
FIG. 5a to 5f are simplified cross sections illustrating modifications of the cavity in the nitride semiconductor laser element of the present invention.
Figure 5B:
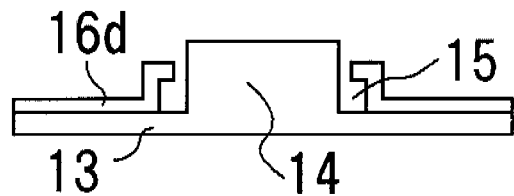
Figure 5C:
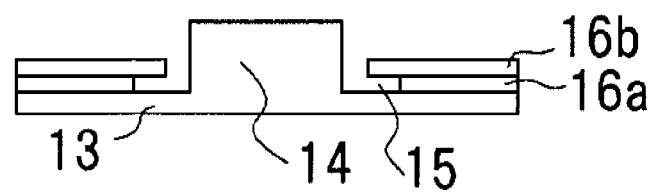
Figure 5D:
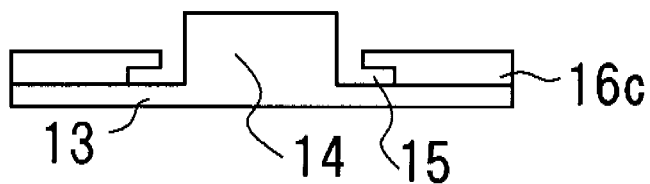
Figure 5E:
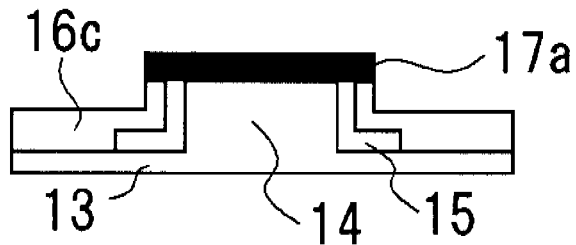
Figure 5F:
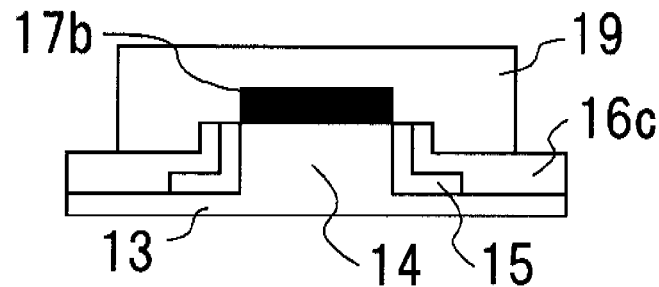

This cavity 15 may not be completely surrounded by the first protective film 16 and the nitride semiconductor layer in the cross sections shown in FIGS. 1a to 1c, and part of the cavity 15 is not defined by these. For example, the part on the upper side of the cavity 15 may be defined by being covered with the first protective film 16 (FIGS. 1b and 5e) or by being covered with the pad electrode 19 or the like (FIG. 5f).

There are no particular restrictions on the size and shape of the cavity 15, but it may have the size and shape that moderate the stress applied to the interface between the first protective film and the ridge or the nitride semiconductor layer. This effectively suppresses stress and further improves service life characteristics. The cavity 15 may be an air gap, void, gap, space or interspace.

The size of the cavity is preferable, for example, for the width at the ridge base periphery (X in FIG. 1b) to be greater than the width at the ridge side faces (Y in FIG. 1b). For instance, directly above the nitride semiconductor layer, a suitable width (X in FIG. 1b) is about 50 to 1000 nm, and a suitable height in that region (W in FIG. 1b) is about 1 to 50 nm. At the places in contact with the ridge side faces, the height (Z in FIG. 1b) will depend on the thickness of the first protective film 16, but is suitably about 30 nm to 1 μm, for example, and preferably 50 to 600 nm. The height may be substantially the same as that of the ridge. The width (Y in FIG. 1b) thereof is suitably about 1 to 50 nm. This is because within these ranges it will be easier to control the size of the cavity, and optical confinement can also be controlled. A cavity that is longer horizontally, with a width X of at least 50 mm, is particularly effective at suppressing optical absorption by the electrode.

Figure 4A:
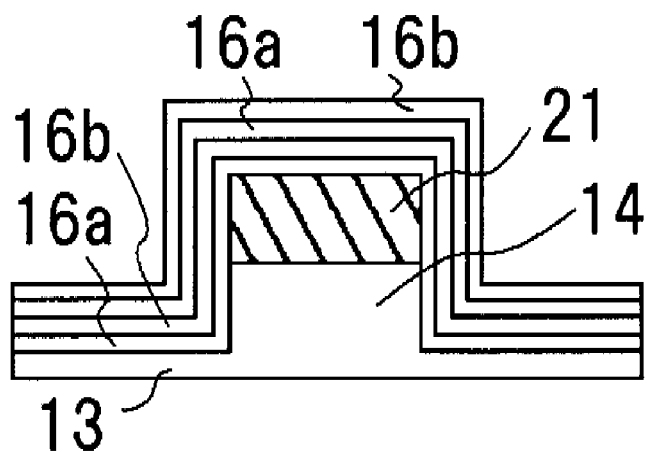
FIG. 4a to 4b are simplified cross-sectional process views illustrating the method for manufacturing the nitride semiconductor laser element of the present invention.
Figure 4B:
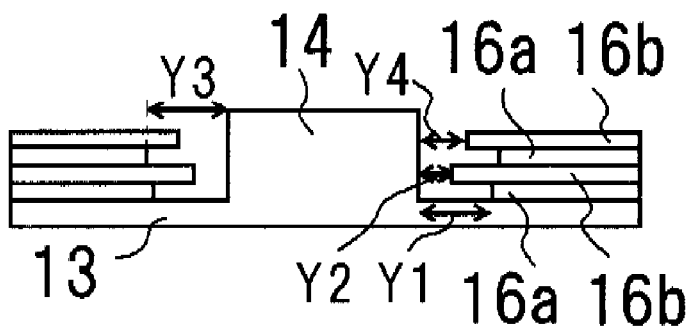

There are no particular restrictions on the shape of the cavity, and various shapes are possible, but examples include an L shape (FIGS. 1b and 5c to 5f), a shape in which a portion is expanded (such as around the ridge base periphery) (FIGS. 5a and 5b), and a shape in which the width varies (FIG. 4b). Also, the cavity preferably has a shape extending in a direction substantially parallel to the ridge. For instance, it may be a single, continuous cavity in the resonator direction, or it may be divided up into a plurality of cavities. This allows light to be confined all along the stripe direction of the ridge. The ends of the cavity on the resonator end face side may be blocked off by a protective film or the like, or may be embedded, or may be left open. The cavity does not necessarily have to have the above-mentioned width and height in all of its regions.

When this cavity is disposed between the ridge and the first protective film, the difference in the refractive indexes of the cavity and ridge (nitride semiconductor) allows light to be confined efficiently in the ridge. For example, if the cavity is an air gap, because air has the smallest refractive index (1.0), the refractive index difference inside and outside the ridge is larger than when there is no cavity between the ridge and the first protective film (light is confined by the refractive index difference between the ridge and the protective film), so optical confinement into the ridge is stronger. Furthermore, when there is a cavity, changes in the refractive index will have less effect even when a material whose refractive index tends to fluctuate with heat is used for the first protective film, for example, so light can be stably confined in the lateral direction. This allows the threshold to be lowered and affords a reduction in power consumption and an improvement in service life characteristics.

Furthermore, the cavity need not be completely empty between the first protective film and the ridge or the nitride semiconductor layer, and as long as there is no adverse effect on the various benefits described above, such as stress moderation and optical confinement, the material used for the first protective film, the nitride semiconductor layer, or a mask may remain in the cavity.

With the present invention, the substrate may be either an insulating substrate or a conductive substrate. In the case of an insulating substrate, part of the nitride semiconductor layer may be removed in the thickness direction to form an n-electrode so that it is in contact with the n-side semiconductor layer, as shown in FIG. 1a.

If a conductive substrate is used, an n-electrode can be disposed so as to be in contact with the face on the opposite side from the face on which the nitride semiconductor layer is formed, as shown in FIG. 1c.

The nitride semiconductor layer is represented by the general formula $In_xAl_yGa_{1-x-y}N$ ($0 \leq x \leq 1$, $0 \leq y \leq 1$, $0 \leq x+y \leq 1$). In addition, B may be partially included as a group III element. Further, N (group V element) may be partly substituted with P or As. The n-side nitride semiconductor layer may contain, as n-type dopants, at least one group VI or IV element such as Si, Ge, Sn, S, O, Ti, Zr, Cd and the like. Further, the p-side nitride semiconductor layer may contain, as p-type dopants, Mg, Zn, Be, Mn, Ca, Sr and the like. It is preferable that dopant concentration be within a range of $5 \times 10^{16}/cm^3$ or more and $1 \times 10^{21}/cm^3$ or less.

The active layer may be or a multiquantum well structure or a single quantum well structure.

There are no particular restrictions on the structure, but it is preferable that the nitride semiconductor layer be configured in an SCH (Separate Confinement Heterostructure) in which an active layer is sandwiched between the n-side nitride semiconductor layer and p-side nitride semiconductor layer, and in which optical guide layers provided with the n-side nitride semiconductor layer and p-side nitride semiconductor layer, respectively, constitute an optical waveguide.

There are no particular restrictions on the method for growing the nitride semiconductor, and any known method for growing a nitride semiconductor, such as MOVPE (metalorganic vapor phase epitaxy), MOCVD (metal-organic chemical vapor deposition), HVPE (hydride vapor phase epitaxy), or MBE (molecular beam epitaxy), can be used preferably. Among these, MOCVD is more preferable because it allows the nitride semiconductor to be growth with good crystallinity.

The ridge is formed on the surface of the nitride semiconductor layer, that is, the p-side semiconductor layer. The ridge functions as a waveguide region, and its width is preferably about 1.0 to 50.0 μm, and even more preferably about 1.0 to 3.0 μm when a beam shape is a single mode. Its height (the depth of etching) can be suitably adjusted according to the thickness, material, etc., of the layer constituting the p-side semiconductor layer, but an example is from 0.1 to 2 μm. The ridge is preferably designed so that its length in the resonator direction will be about 100 to 2000 μm. All of the ridge may have the same width in the resonator direction, and its side faces may be vertical or tapered. If they are tapered, the taper angle is preferably about 60 to 90°.

The first protective film is formed so that it covers all or part of the ridge side faces in a non-contact state, and covers part of the nitride semiconductor surface of the ridge base periphery in a non-contact state, and covers part of the nitride semiconductor layer surface in a contact state. The phrase "covers in a non-contact state" as used here means that the first protective film is opposed to the corresponding ridge side face and separated at a distance of about 1 to 50 nm, for example, not touching the ridge side face. However, the first protective film need not be present up to a height at which the entire ridge side face is covered in the height direction, and may instead be present up to a height such that only the lower part of the ridge side face is covered, and the upper part of the ridge side face is not covered, and may be covered so as to be in contact with or electrically connected to the p-electrode discussed below (see FIGS. 5b to 5d).

The first protective film can be formed, for example, from an insulating material with a lower refractive index than the nitride semiconductor layer. Specific examples include one or more layers of oxides, nitrides, or the like of Zr, Si, V, Nb, Hf, Ta, Al or the like. This ensures a refractive index differential with respect to the nitride semiconductor layer, and particularly, the p-side semiconductor layer, which suppresses the leakage of light from the active layer, allows light to be confined more efficiently in the ridge. It is particularly favorable to use a single-layer film of an oxide of zirconium or silicon, or a laminated film of two or more layers of these. Using a material such as this makes it easier to control the size and shape of the cavity. When a laminated film of two or more layers is used, the layers may be composed of the same elements, but in different compositional ratios, or the composition may be the same and the film quality different, and preferably there are two or more layers with different compositions. There are no particular restrictions on the thickness of the first protective film, but about 10 to 2000 nm is suitable, for example, and 10 to 500 nm is even better. Increasing the thickness of the first protective film allows capacity to be reduced more. Particularly when the thickness of the first protective film is at least 50 nm, the capacity reduction effect and other laser diode characteristics can be further improved. The first protective film in the region where the cavity is formed preferably has a uniform thickness. This makes it easier to control the capacity.

In the case of a laminated film, the layer in contact with the ridge side faces and the ridge base periphery (hereinafter this may be referred to as the "lower layer") is preferably formed from a material with a higher etching rate than the layer above (hereinafter referred to as "upper layer"). A laminated film in which the layers corresponding to the lower layer and upper layer are alternately formed from three or more layers may also be used. This allows the cavity to be disposed around the ridge base periphery, and since the width and size of the cavity can be controlled more easily, the lower limit to the refractive index can be expanded. As a result, the confinement of light can be controlled, such as the shape of a FFP.

The etching rate, optical absorption, the refractive index of the light, and so forth of the first protective film can be varied by varying the material, the film thickness, the film quality, the film formation method and conditions used for the first protective film, the lamination state, and other such parameters. Preferably, these parameters are suitably adjusted to form a first protective film having the desired characteristics.

The "electrode" in the present invention refers to an electrode that is electrically connected to, so-called, the p-side nitride semiconductor layer. Preferably, an electrode that is electrically connected to the nitride semiconductor layer on the paired n-side is also provided.

As shown in FIG. 1a and 1c, a p-electrode is preferably formed on the nitride semiconductor layer and on the first protective film 16. Forming the electrode continuously on the uppermost nitride semiconductor layer and the first protective film helps prevent the separation of the first protective film. Also, since the first protective film 16 and the electrode 17 are formed via the cavity 15, optical absorption by the electrode can be suppressed.

The electrode can be formed, for example, by a single-layer film or a laminated film of palladium, platinum, nickel, gold, titanium, tungsten, copper, silver, zinc, tin, indium, aluminum, iridium, rhodium, ITO, or another such metal or alloy. Examples of the material used for the p-electrode include those based on Ni—Au, Ni—Au—Pt, Pd—Pt, and Ni—Pt. The thickness of the electrode can be suitably adjusted according to the material being used and so forth, but about 50 to 500 nm is suitable, for example. The electrode may be formed on each of a p-side and n-side semiconductor layer or substrate, and one or more conductive layers such as a pad electrode may be formed on this electrode.

Also, a second protective film is preferably formed in part of the region on the first protective film. The second protective film preferably further covers the side faces of the nitride semiconductor layer and/or the side faces or surface of the substrate, for example. The second protective film may be formed of the same material as the first protective firm. This ensures not only the proper insulation but also effectively protects the exposed side faces, surface, etc. There are no particular restrictions on the thickness of the second protective film, but about 100 to 1000 nm is suitable, for example.

The following is an example of the method of the present invention for manufacturing a nitride semiconductor laser element.

Formation of Nitride Semiconductor Layer

At first, a nitride semiconductor layer is formed on a substrate.

An example of this substrate may be a nitride semiconductor substrate having an off angle of, for example, at least 0° and no more than 10° on its first main face and/or second main face. The thickness of the substrate may be at least 50 μm and no more than 10 mm. A nitride semiconductor substrate can be formed by MOCVD, HVPE, MBE, or another such vapor phase growth method, or by a melt process, flow process, high-pressure process, or hot water synthesis process in which crystals are grown in a supercritical fluid, or the like. A commercially available substrate may also be used.

A nitride semiconductor layer is grown on the first main face of this nitride semiconductor substrate.

The nitride semiconductor layer is grown by growing an n-side semiconductor layer, an active layer, and a p-side semiconductor layer in that order by MOCVD, for example, under either reduced pressure or atmospheric pressure. The n-side semiconductor layer and p-side semiconductor layer may have a single-film structure, a multilayer film structure, or a super-lattice structure comprising of two layers with different compositional ratios. When the n-side semiconductor layer and p-side semiconductor layer is formed by a multilayer film or a super-lattice structure, all of layers in the n-side semiconductor layer or p-side semiconductor layer do not necessarily have to contain the n-type impurity or p-type impurity.

The n-side semiconductor layer preferably is formed by a multilayer film. For instance, the first n-side semiconductor layer may be $Al_xGa_{1-x}N$ ($0 \leq x \leq 0.5$), preferably $Al_xGa_{1-x}N$ ($0 < x \leq 0.3$). A specific example of growth conditions is one in which the growth temperature inside the reaction furnace is at least 1000° C. and the pressure is no higher than 600 Torr. Also, the first n-side semiconductor layer can function as a cladding layer. The thickness of the first n-side semiconductor layer may be about 0.5 to about 5 μm.

The second n-side semiconductor layer can function as a light guide layer, and can be formed from $Al_xGa_{1-x}N$ ($0 \leq x \leq 0.3$). The thickness of the second n-side semiconductor layer may be about 0.5 to about 5 μm.

The active layer preferably has at least one layer comprising indium (In) and has a general formula of $In_xAl_yGa_{1-x-y}N$ ($0 < x \leq 1$, $0 \leq y < 1$, $0 < x+y \leq 1$). Light can be emitted in the UV band by raising the aluminum content. Light can also be emitted on the longer wavelength side, with emission from 360 to 580 nm being possible. The light emission efficiency can be enhanced by forming the active layer from a quantum well structure.

The p-side semiconductor layer is laminated on the active layer. The first p-side semiconductor layer can be formed from $Al_xGa_{1-x}N$ ($0 \leq x \leq 0.5$) containing a p-type impurity. The first p-side semiconductor layer functions as a p-side electron confinement layer. The second p-side semiconductor layer can be formed from $Al_xGa_{1-x}N$ ($0 \leq x \leq 0.3$), and the third p-side semiconductor layer from $Al_xGa_{1-x}N$ ($0 \leq x \leq 0.5$) containing a p-type impurity. The third p-side semiconductor layer is preferably a super-lattice structure composed of GaN and AlGaN, and functions as a cladding layer. The fourth p-side semiconductor layer can be formed from $Al_xGa_{1-x}N$ ($0 \leq x \leq 1$) containing a p-type impurity. Indium may be included as a mixed crystal in these semiconductor layers. The first p-side semiconductor layer and the second p-side semiconductor layer can be omitted. The suitable thickness of each layer is about 3 nm to about 5 μm.

Optionally, the nitride semiconductor layer may be etched to expose an n-side semiconductor layer (such as the first n-side semiconductor layer). This exposure can be accomplished, for example, by RIE using $Cl_2$, $CCl_4$, $BCl_3$, or $SiCl_4$ gas or the like. This allows stress to be relieved. Also, a resonator face can be formed at the same time during the exposure of this n-side semiconductor layer by etching so as to expose an end face perpendicular to the striped waveguide region. However, the formation of the resonator face may instead be performed by a separate step involving cleavage.

After this, the resistance of the p-side semiconductor layer is preferably lowered by annealing the wafer in a reaction vessel at a temperature of at least 700° C. and in a nitrogen atmosphere.

Formation of Ridge

A mask pattern is formed on the nitride semiconductor layer, and this mask pattern is used to perform etching and form a ridge.

The mask pattern can be formed in the desired shape, for example, by using an oxide film such as $SiO_2$ or a nitride such as SiN and employing a known method such as photolithography and etching. The thickness of the mask is favorably such that the mask pattern remaining on the ridge after the formation of the ridge can be removed by the lift-off method in a subsequent step. A range of about 0.1 to about 5.0 μm can be used, for example.

The mask pattern is preferably formed by using a CVD apparatus or the like, for example. Also, the mask pattern is preferably formed by etching into the desired shape using RIE or another such method, for example. This etching can be favorably performed by using RIE and using a chlorine-based gas such as $Cl_2$, $CCl_4$, $SiCl_4$, and/or $BCl_3$.

After this, a ridge is formed in a striped pattern, for example, by utilizing the mask pattern to etch the nitride semiconductor layer. A favorable example of the conditions here includes etching at a $Cl_2$ gas flow. There are no particular restrictions on the substrate temperature during this etching, but a lower temperature (such as about 60 to about 200° C.) is preferable.

Formation of First Protective Film

The first protective film is formed on the nitride semiconductor layer. The first protective film can be formed by any method known in this field, such as CVD, vapor deposition, ECR (electron cyclotron resonance plasma) sputtering, magnetron sputtering, and so on, which can be used to form a single layer or a laminated structure. A single-layer film may be formed one or more times, by varying the manufacturing method or conditions, to produce a film with the same composition but different film quality. For example, a first protective film formed by magnetron sputtering will have a higher etching rate than a first protective film formed by ECR sputtering. Also, a first protective film formed by ECR sputtering may have poor film quality at the interface with the nitride semiconductor layer, so just this portion will be etched faster, and a first protective film such as this can also be utilized.

When the first protective film is formed, it is preferably formed on the nitride semiconductor layer in a state in which the mask pattern used in the formation of the above-mentioned ridge is still present.

Formation of Cavity

The cavity is formed by removing the mask pattern and the first protective film present on the mask pattern, and removing the first protective film extending from the ridge side faces to the ridge base periphery. This removal can be accomplished by any known dry or wet etching method. For example, it is favorable to employ a lift-off method or wet etching using HF and/or BHF. This etching is performed such that a cavity can be ensured from both side faces of the ridge to its base periphery, which is accomplished by suitably adjusting the material, the film thickness, the lamination structure, the film formation method of the first protective film, the etching method, the type of etchant, the etchant concentration, the etching time, and other such conditions. In addition, the first protective film is worked such that it covers in a contact state the region of the nitride semiconductor layer surface other than the ridge and its surrounding area, and covers in a non-contact state the region from the ridge base periphery to the side faces of the ridge. The width of this cavity can be adjusted by varying the slope angle of the ridge, the type and concentration of etchant, the treatment (immersion) time, and so forth.

Formation of Electrode

After this, a p-electrode is formed on the fourth p-side semiconductor layer, which is the surface of the ridge. The p-electrode is preferably formed only on the fourth p-side semiconductor layer. If the p-electrode has a two-layer structure composed of nickel and gold, for example, then first a film of nickel is formed in a thickness of about 5 to about 20 nm on the fourth p-side semiconductor layer, and then a film of gold is formed in a thickness of about 50 to about 300 nm. If the p-electrode has a three-layer structure, then it is formed in the order of Ni—Au—Pt or Ni—Au—Pd. The nickel and gold may have the same thickness as in a two-layer structure, and the platinum or palladium that serves as the final layer is favorably from about 50 to about 500 nm.

It is preferable to perform ohmic annealing after the p-electrode has been formed. Suitable annealing conditions include, for example, a temperature of at least 300° C., and preferably at least 500° C., in an atmosphere containing nitrogen and/or oxygen.

Next, a second protective film may be formed on the first protective film. The second protective film can be formed by any method known in this field.

Optionally, a pad electrode may be formed on the p-electrode. This pad electrode is preferably a laminate composed of nickel, titanium, gold, platinum, palladium, tungsten, or another such metal. More specifically, the pad electrode is formed by forming W—Pd—Au or Ni—Ti—Au in that order, starting from the p-electrode side. There are no particular restrictions on the thickness of the pad electrode, but the thickness of the gold film that serves as the final layer is preferably at least 100 nm.

Also, an n-electrode may be formed on any n-side semiconductor layer formed on the first main face of the nitride semiconductor substrate, as shown in FIG. 1a, or an n-electrode may be formed on all or part of the second main face of the nitride semiconductor substrate, as shown in FIG. 1c. For example, films of vanadium (about 10 nm thick), platinum (about 200 nm thick), and gold (about 300 nm thick) are formed, starting from the second main face of the substrate side. The n-electrode can be formed, for example, by sputtering, CVD, vapor deposition, or another such method. The lift-off method is preferably used to form the n-electrode, and annealing is preferably performed at 500° C. or higher after the n-electrode has been formed. But the annealing step may be omitted.

A metallized electrode may also be formed on the n-electrode. This metallized electrode may be formed from, for example, Ti—Pt—Au—(Au/Sn), Ti—Pt—Au—(Au/Si), Ti—Pt—Au—(Au/Ge), Ti—Pt—Au—In, Au/Sn, In, Au/Si, Au/Ge, or the like.

Formation of Chip

After the n-electrode has been formed, it is preferable to divide the wafer into bars in order to form resonator end faces of the nitride semiconductor layer that are perpendicular to the p-electrode stripes. The term resonator end faces here refers to the M plane (1-100) or the A plane (11-20). Methods for dividing the wafer into bars include blade breaking, roller breaking, and press breaking.

Also, a reflective mirror may be formed on the resonator end faces. This reflective mirror is a dielectric multilayer film composed of $SiO_2$, $ZrO_2$, $TiO_2$, $Al_2O_3$, $Nb_2O_5$, or the like. The reflective mirror is preferably formed on the light exit face and/or the light reflecting side of the resonance face. It is preferably formed on both the light exit face and the light reflecting side of the resonance face. The reflective mirror can be formed with better reproducibility if the resonance face has been formed by cleavage. Also, the end faces of the cavities may be covered by this mirror. This prevents dust and so forth from getting into the cavity during laser drive or in subsequent steps, and prevents a drop in the function of the cavity.

The bar-shaped nitride semiconductor substrates can be divided parallel to the electrode stripe direction to produce chips with the nitride semiconductor laser elements.

Examples of the nitride semiconductor laser element of the present invention, and the method for manufacturing this element, will now be described in detail through reference to the drawings, but the present invention is not limited to or by the following examples.

EXAMPLE 1

The laser element in this example oscillates in a band of 390 nm and under, and as shown in FIGS. 1a and 1b, a first buffer layer (100 nm) composed of silicon-doped $Al_{0.02}Ga_{0.98}N$ and a second buffer layer (150 nm) composed of silicon-doped $In_{0.1}Ga_{0.9}N$ are formed on a substrate 10 composed of n-type GaN. Over this, an n-side cladding layer (0.7 μm) composed of silicon-doped $Al_{0.11}Ga_{0.89}N$ and an n-side light guide layer (0.15 μm) composed of undoped $Al_{0.06}Ga_{0.94}N$ are formed as an n-side semiconductor layer 11, and a barrier layer (7 nm) composed of silicon-doped $Al_{0.15}Ga_{0.85}N$, a well layer (10 nm) composed of undoped $In_{0.01}Ga_{0.09}N$, and a barrier layer (5 mm) composed of $Al_{0.15}Ga_{0.85}N$ are formed as an active layer 12 composed of a single quantum well. Over this are formed a p-side cap layer (10 nm) composed of magnesium-doped p-side $Al_{0.30}Ga_{0.70}N$, a p-side light guide layer (0.15 μm) composed of undoped $Al_{0.06}Ga_{0.94}N$, a p-side cladding layer composed of a superlattice layer with a combined thickness of 0.6 μm and comprising a layer (2.5 nm) composed of undoped $Al_{0.13}Ga_{0.87}N$ and a layer composed of magnesium-doped $Al_{0.09}Ga_{0.91}N$, and a p-side contact layer (15 nm) composed of magnesium-doped p-side GaN.

A stripe-shaped ridge 14 (slope angle of 80°) with a height of 0.7 μm and a width of 2.1 μm is formed on the surface of the p-side semiconductor layer by etching.

A first protective film 16 composed of $ZrO_2$ is formed on the surface of the p-side semiconductor layer except for the upper face of the ridge 14, and a p-electrode 17 is formed on the upper face of the ridge 14. A second protective film 18 is formed on part of the surface of the first protective film and the side faces of the nitride semiconductor layer, and a pad electrode 19 connected to the p-electrode 17 is further formed. An n-electrode 20 is formed on the n-side semiconductor layer.

With this laser element, the first protective film 16 covers part of the nitride semiconductor layer surface in a contact state, and covers the side faces of the ridge 14 from the base periphery of the ridge 14 in a non-contact state, the result being that a cavity 15 is disposed from the ridge 14 side faces to the ridge 14 base periphery. The dimensions of this cavity are, for example, X of 220 nm, Y of 10 nm, Z of 300 nm, and W of 10 nm.

This laser element can be manufactured as follows.

Firstly, an n-GaN substrate is set in a MOVPE reaction vessel, and a first buffer layer made of silicon-doped $(0.8 \times 10^{18}/cm^3)$ n-$Al_{0.02}Ga_{0.98}N$ is formed by using tri-methyl aluminum (TMA), tri-methyl gallium (TMG) and ammonia (NII$_3$), and silane gas (SiH$_4$) used as an impurity gas. After growing the first buffer layer, a second buffer layer made of silicon-doped $(3 \times 10^{18}/cm^3)$ n-$In_{0.1}Ga_{0.9}N$ is formed by using tri-methyl indium (TMI), TMG and ammonia (NH$_3$), and silane gas (SiH$_4$) used as an impurity gas while raising the temperature.

Next, an n-cladding layer made of silicon-doped $(1 \times 10^{18}/cm^3)$ $Al_{0.11}Ga_{0.89}N$ is formed by using TMA, TMG and ammonia, and silane gas used as an impurity gas.

After that, an n-side optical guide layer made of undoped $Al_{0.06}Ga_{0.94}N$ is formed by using TMA, TMG and ammonia used as material gas.

Then by setting the temperature to 950° C., a barrier layer made of $Al_{0.15}Ga_{0.85}N$ doped with Si in a concentration of $5 \times 10^{18}/cm^3$ by using TMG, TMA and ammonia as the material gas and silane gas as the impurity gas. Then, the supply of silane gas is stopped and a well layer made of undoped $In_{0.01}Ga_{0.99}N$ is formed by using TMI, TMG and ammonia. The barrier layer made of $Al_{0.15}Ga_{0.85}N$ by using TMA, TMG and ammonia with the same temperature, thereby to form the active layer of single quantum well structure (SQW).

Then a p-side cap layer made of p-side $Al_{0.30}Ga_{0.70}N$ doped with Mg in a concentration of $1 \times 10^{20}/cm^3$ is formed by stopping the supply of TMI and supplying Cp$_2$Mg. Then with the supply of Cp$_2$Mg being stopped, a p-side optical guide layer made of undoped $Al_{0.06}Ga_{0.94}N$ is formed at a temperature of 1050° C. While the p-side optical guide layer is grown as an undoped layer, diffusion of Mg from the p-side cap layer increases the Mg concentration to $5 \times 10^{16}/cm^3$ and may turn the layer to p-type conductivity. Then with the supply of Cp$_2$Mg being stopped and TMA being supplied, a layer of undoped $Al_{0.13}Ga_{0.87}N$ is formed at 1050° C., then with Cp$_2$Mg being supplied, a layer of Mg-doped $Al_{0.09}Ga_{0.91}N$ is formed with Mg concentration of $1 \times 10^{19}/cm^3$, thereby forming the p-side cladding layer constituted from super lattice structure of the total thickness of 0.6 μm. Finally, a p-side contact layer made of p-type GaN doped with Mg in a concentration of $1 \times 10^{20}/cm^3$ is formed on the p-side cladding layer.

A wafer comprising a nitride semiconductor layer laminated on a substrate is taken out of a reaction vessel, and as shown in FIG. 2a, a mask pattern 21 composed of SiO$_2$ and consisting of a stripe with a width of 2.3 μm is formed on the surface of the p-side contact layer that is the outermost layer.

After this, as shown in FIG. 2b, etching is performed by RIE (reactive ion etching) up to the interface between the p-side cladding layer and the p-side light guide layer to form the stripe-shaped ridge 14. Also, the nitride semiconductor layer is etched to expose a part of the n-side cladding layer.

Then, as shown in FIG. 2c, a first protective film 16c composed of a single layer of $ZrO_2$ is formed using an ECR sputtering device on the surface of the nitride semiconductor layer in a state in which the mask pattern 21 has been formed. This first protective film 16c is formed in a thickness of 100 nm at an RF of 500 W and microwave frequency of 500 W.

After this, as shown in FIG. 2d, the mask pattern 21 formed on the p-side contact layer is dissolved away, and the first protective film 16c formed on the p-side contact layer is removed along with the mask pattern 21 composed of SiO$_2$ by lift-off method. Further, buffered hydrofluoric acid (hereinafter sometimes referred to as BFH) is used at an immersion time of 15 minutes in this step so that the cavity 15 will be formed in a specific size by etching the $ZrO_2$ at the interface between the nitride semiconductor layer and the first protective film ($ZrO_2$) 16c.

Next, a p-ohmic electrode composed of nickel and gold is formed in the shape of a stripe on the outermost ridge surface of the p-side contact layer, and on this is formed a p-side pad electrode that is electrically connected to the p-side ohmic electrode.

Also, an n-ohmic electrode is formed on the n-cladding layer. Or, n-side contact layer may be formed between n-GaN substrate and n-side cladding layer, and an n-ohmic electrode may be formed on the surface of the n-side contact layer. Also, an n-ohmic electrode may be formed on the surface of the n-substrate exposed by removing the surface of the n-cladding layer. Alternatively, when the step of exposure of the nitride semiconductor layer formed on the substrate is omitted as describe above, an n-ohmic electrode may be formed on the back side of an n-type GaN substrate, as shown in FIG. 1c.

After the p- and n-electrodes have thus been formed, the GaN is cleaved at the M plane of the GaN substrate (this plane corresponds to the side face of a hexagonal prism when the nitride semiconductor is expressed as a hexagonal prism) to put the wafer in the form of a bar, and a resonator face is produced at the cleavage plane of this bar. After the resonator face has been produced, the bar-shaped wafer is diced into chips in a direction perpendicular to the resonator face.

The electrodes were wire bonded to the semiconductor laser chips thus obtained, and laser oscillation was attempted at room temperature, whereupon it was confirmed that continuous oscillation occurred at room temperature and at a threshold current density of 2.5 kA/cm$^2$ and an oscillation wavelength of 375 nm, and the service life was indicated to be over 1000 hours.

Ten of the same semiconductor laser chips were formed by the same method as above, and these were similarly subjected to continuous oscillation. These results are given in FIG. 6.

Figure 6:
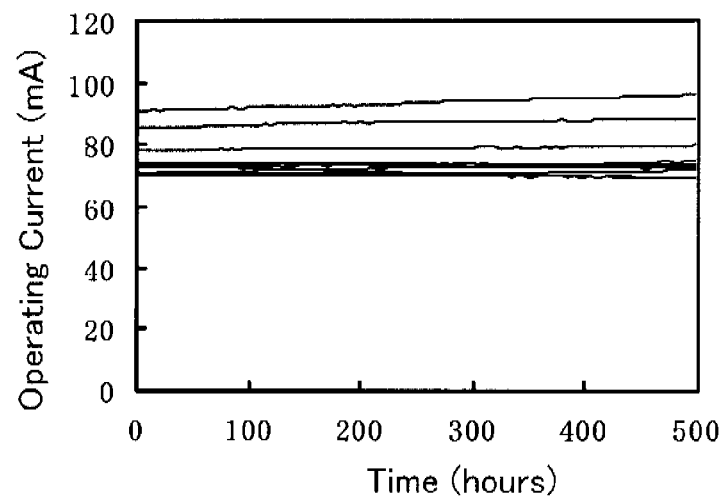
FIG. 6 is a graph of the relationship between operating current and time for the nitride semiconductor laser element of the present invention.

FIG. 6 shows that a stable operating voltage was exhibited over an extended period, although there was a slight difference in the operating current value.

Meanwhile, as a comparative example, ten semiconductor laser elements in which no cavity was intentionally introduced were formed under various methods and conditions for forming the first protective film, etching conditions, and so forth, and continuous oscillation was performed in the same manner as above. As a result, there was a large fluctuation in the current value over time for nearly all of the chips, and stable continuous oscillation could not be achieved. Also, a few of the chips broke and could no longer oscillate.

Figure 7:
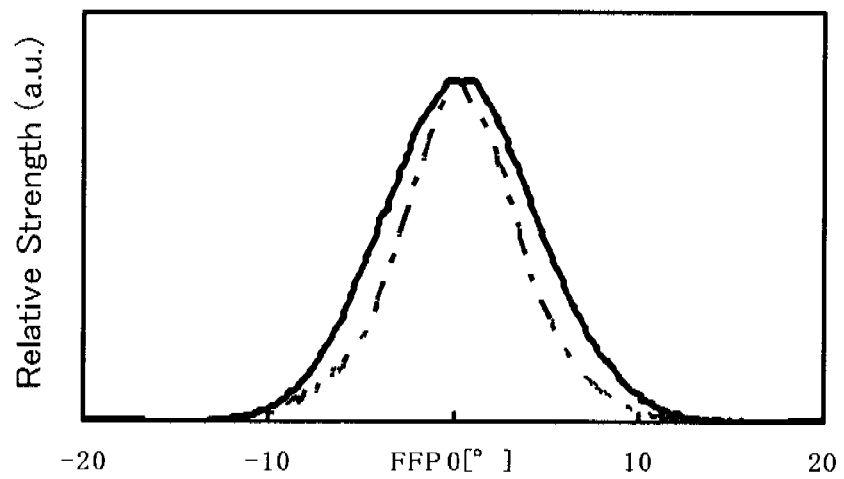
FIG. 7 is a graph of the relationship between relative strength and FFP for the nitride semiconductor laser element of the present invention.

The FFP$_{//}$ was measured for each of the laser chip of the present invention and the laser chip of the comparative example above obtained, which confirmed that, as shown in FIG. 7, light could be confined better with the laser chip of the present invention (solid line) than with the chip of the comparative example (broken line).

EXAMPLE 2

Substantially the same element as in Example 1 is formed in the same way, except that in this example the first protective film has a two-layer structure with $ZrO_2$ of different film quality.

Figure 3A:
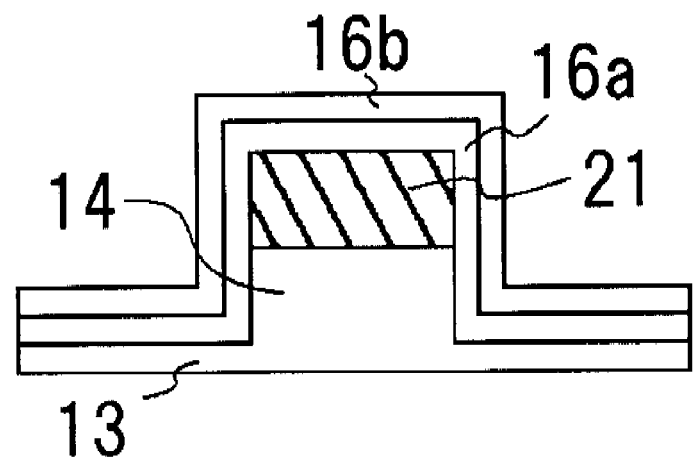
FIG. 3a to 3b are simplified cross-sectional process views illustrating the method for manufacturing the nitride semiconductor laser element of the present invention.

First, just as in Example 1, a ridge is formed on the nitride semiconductor layer surface using a mask pattern, and as shown in FIG. 3a, a $ZrO_2$ film with a thickness of 10 nm is formed as a lower layer 16a of the first protective film using a magnetron sputtering device. Next, a $ZrO_2$ film with a thickness of 90 nm is formed as an upper layer 16b using an ECR sputtering device.

Figure 3B:
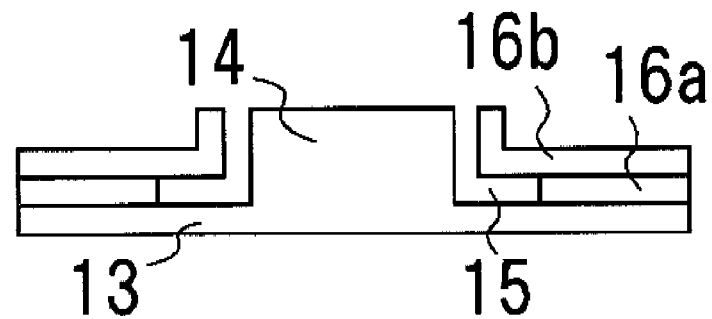

The first protective films 16a and 16b thus obtained are annealed at 300° C. and immersed in BHF for 15 minutes, which, as shown in FIG. 3b, dissolved away the mask pattern formed on the p-side contact layer, and the first protective film on the p-side contact layer is removed along with the mask pattern by lift-off method. Further, a cavity is formed in this step by etching the lower layer 16a and upper layer 16b formed as the first protective film, from the ridge side faces. This cavity can be formed by utilizing the etching rate differential between the $ZrO_2$ film serving as the lower layer 16a and the $ZrO_2$ film serving as the upper layer 16b.

With the cavity in this semiconductor laser element, the dimensions corresponding to X, Y, Z, and W in FIG. 1b are 250 nm, 5 nm, 150 nm, and 10 nm, respectively. With this configuration, the size of the cavity can be easily controlled, and the refractive index can be varied with ease.

EXAMPLE 3

Substantially the same element as in Example 1 is formed in the same way, except that in this example the first protective film has a two-layer structure composed of different materials.

First, just as in Example 1, a ridge is formed on the nitride semiconductor layer surface using a mask pattern, and an $SiO_2$ film with a thickness of 10 nm is formed as the lower layer of the first protective film using an ECR sputtering device. Next, a $ZrO_2$ film with a thickness of 40 nm is formed as the upper layer using an ECR sputtering device.

The first protective film thus obtained is annealed at 400° C. and immersed in BHF for 15 minutes, which dissolved away the mask pattern formed on the p-side contact layer, and the first protective film on the p-side contact layer is removed along with the mask pattern by lift-off method. Further, a cavity is formed in this step at the ridge side faces and the ridge bottom face by etching the $SiO_2$ film serving as the lower layer and the $ZrO_2$ film serving as the upper layer (formed as the first protective film) from the ridge side faces. This cavity can be formed by utilizing the etching rate differential between the $SiO_2$ film serving as the lower layer and the $ZrO_2$ film serving as the upper layer.

With the cavity in this semiconductor laser element, the dimensions corresponding to X, Y, Z, and W in FIG. 1b are 50 nm, 5 nm, 300 nm, and 10 nm, respectively. With this configuration, the size of the cavity can be easily controlled, and the refractive index can be freely controlled to be larger.

EXAMPLE 4

Substantially the same element as in Example 1 is formed in the same way, except that in this example the first protective film is a multilayer film.

First, just as in Example 1, a ridge is formed on the nitride semiconductor layer surface using a mask pattern, and an $SiO_2$ film with a thickness of 10 nm is formed as the lower layer 16a of the first protective film using an ECR sputtering device, as shown in FIG. 4a. Next, a $ZrO_2$ film with a thickness of 30 nm is formed as the upper layer 16b using an ECR sputtering device. This is repeated twice to form a first protective film with a total thickness of 80 nm.

The multilayer first protective film thus obtained is annealed at 400° C. and immersed in BHF for 15 minutes, which, as shown in FIG. 4b, dissolved away the mask pattern formed on the p-side contact layer, and the first protective film on the p-side contact layer is removed along with the mask pattern by lift-off method. Further, a cavity is formed in this step by etching the lower layer 16a and the upper layer 16b (formed as the first protective film) from the ridge side faces. This cavity can be formed with a step by utilizing the etching rate differential between the $ZrO_2$ film and the $SiO_2$ film.

With the cavity in this semiconductor laser element, the dimensions corresponding to X, Z, and W in FIG. 1b are 300 nm, 200 nm, and 10 nm, respectively, while Y1, Y2, Y3, and Y4 are about 300 nm, 5 nm, 250 nm, and 5 nm, respectively.

With this configuration, the refractive index can be easily controlled by adjusting the step of the cavity at the side faces.

INDUSTRIAL APPLICABILITY

The nitride semiconductor laser element of the present invention can be utilized in optical disk applications, optical communications systems, printers, exposure applications, measurements, and so forth. Also, the nitride semiconductor laser element of the present invention can be utilized in bio-related excitation light sources and the like that are capable of detecting the presence or the location of a substance having sensitivity to a specific wavelength by irradiating the substance with light obtained from a nitride semiconductor laser.

This application claims priority to Japanese Patent Application Nos. 2006-77237 and 2007-35858. The entire disclosure of Japanese Patent Application Nos. 2006-77237 and 2007-35858 are hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A nitride semiconductor laser element, comprising a substrate, a nitride semiconductor layer laminated on said substrate and having a ridge on its surface, a first protective film that covers said nitride semiconductor layer, and an electrode formed on the ridge and the first protective film,
    wherein the first protective film covers part of the nitride semiconductor layer surface in a contact state, and covers from the periphery around the base of the ridge to the side faces of the ridge in a non-contact state, and a cavity is disposed from said ridge side faces to the ridge base periphery.

2. The element according to claim 1, wherein the cavity is wider at the ridge base periphery than at the ridge side faces.

3. The element according to claim 1, wherein the cavity height is at least 30 nm and 1 µm or less.

4. The element according to claim 1, wherein the first protective film has a lower refractive index than the nitride semiconductor layer.

5. The element according to claim 1, wherein part of the cavity is defined by the electrode.

6. The element according to claim 1, wherein the cavity is disposed substantially parallel to the ridge.

7. The element according to claim 1, wherein the first protective film is a multilayer structure comprising two or more layers of different compositions.

8. The element according to claim 1, further comprising a second protective film on the first protective film.

9. A method for manufacturing a nitride semiconductor laser element, comprising the steps of:
    forming a nitride semiconductor layer on a substrate;
    forming a mask pattern on said nitride semiconductor layer and forming a ridge using said mask pattern for etching;
    forming a first protective film on both sides of the ridge, the mask pattern, and nitride semiconductor layer exposed after the formation of the ridge; and
    removing the first protective film present on the mask pattern, and the mask pattern, and removing the first protective film extending from the ridge side faces to the ridge base periphery to form an cavity in at least part of the region which is an interface between the nitride semiconductor layer and the first protective film, and is extending from both sides of the ridge to the surface of the nitride semiconductor layer on both sides of the ridge.

10. The method according to claim 9, wherein the first protective film is a multilayer structure comprising two or more layers of different compositions.

11. The method according to claim 9, wherein the first protective film is formed by a lower layer and an upper layer of different dissolution rates.

12. The method according to claim 9, wherein the lower layer of the first protective film is formed from the same material as the first mask pattern.

* * * * *